(12) United States Patent
Cook et al.

(10) Patent No.: US 6,506,691 B2
(45) Date of Patent: *Jan. 14, 2003

(54) HIGH RATE SILICON NITRIDE DEPOSITION METHOD AT LOW PRESSURES

(75) Inventors: Robert C. Cook, Livermore, CA (US); Daniel L. Brors, Livermore, CA (US)

(73) Assignee: Torrex Equipment Corporation, Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/396,590

(22) Filed: Sep. 15, 1999

(65) Prior Publication Data

US 2001/0041218 A1 Nov. 15, 2001

Related U.S. Application Data (60) Division of application No. 08/909,461, filed on Aug. 11, 1997, now Pat. No. 6,352,593, which is a continuation-in-part of application No. 09/228,835, filed on Jan. 12, 1999, now Pat. No. 6,167,837, which is a continuation-in-part of application No. 09/228,840, filed on Jan. 12, 1999, now Pat. No. 6,321,680.

(51) Int. Cl.[7] .............................................. H01L 21/469
(52) U.S. Cl. ..................................... 438/791; 156/89.15
(58) Field of Search ........................ 437/102; 427/579, 427/49, 255.1, 573; 118/719, 715

(56) References Cited

U.S. PATENT DOCUMENTS

| | | | | |
|---|---|---|---|---|
| 4,105,810 A | | 8/1978 | Yamazaki et al. ........... 427/248 |
| 4,745,088 A | * | 5/1988 | Inoue et al. ................. 437/102 |
| 4,784,874 A | * | 11/1988 | Ishihara et al. ................ 427/49 |
| 4,830,890 A | * | 5/1989 | Kanai ....................... 427/255.1 |
| 4,962,726 A | * | 10/1990 | Matsushita et al. ......... 118/719 |
| 5,058,526 A | * | 10/1991 | Matsushita et al. ......... 118/715 |
| 5,108,792 A | | 4/1992 | Anderson et al. ........ 427/248.1 |
| 5,391,232 A | * | 2/1995 | Kanai et al. ................. 118/715 |
| 5,399,387 A | | 3/1995 | Law et al. ................... 427/574 |
| 5,482,739 A | | 1/1996 | Hey et al. ................. 427/255.2 |
| 5,551,985 A | | 9/1996 | Brors et al. .................. 118/725 |
| 5,629,043 A | | 5/1997 | Inaba et al. .................... 427/79 |
| 5,663,087 A | | 9/1997 | Yokozawa ................... 438/762 |
| 5,720,821 A | * | 2/1998 | Halpern ...................... 118/719 |
| 5,855,970 A | * | 1/1999 | Inushima et al. ........... 427/579 |
| 5,910,342 A | * | 6/1999 | Hirooka et al. ............. 427/573 |

* cited by examiner

*Primary Examiner*—Gregory Mills
*Assistant Examiner*—Rudy Zervigon
(74) *Attorney, Agent, or Firm*—David Jaffer; Pillsbury Winthrop LLP (57) ABSTRACT

A method for high rate silicon nitride deposition at low pressures, including a method of operating a CVD reactor providing a novel combination of wafer temperature, gas flow and chamber pressure resulting in both rapid deposition and a uniform, smooth film surface. According to the method, a wafer is placed in a vacuum chamber wherein a reactant gas flow of silane and ammonia is directed in parallel with the wafer surface via a plurality of temperature controlled gas injectors, the gas being confined to a narrow region above the wafer. The gas is injected at a high velocity, causing the deposition rate to be limited only by the rate of delivery of unreacted gas to the wafer surface and the rate of removal of reaction byproducts. The high velocity gas stream passing across the wafer has the effect of thinning the layer adjacent the wafer surface containing reaction by-products, known as the "boundary layer," resulting in faster delivery of the desired reactant gas to the wafer surface. The rapid gas flow also reduces the gas residence time above the substrate surface, and sweeps out unwanted reaction by-products resulting in a further increase in the relative concentration of the desired reactant species and reduced incorporation of unwanted reaction by-products in the deposited film.

12 Claims, 7 Drawing Sheets

PROCESS SPECIFICATIONS

SILANE FLOW:          100 - 400 SCCM
AMMONIA FLOW:         500 - 600 SCCM
CHAMBER PRESSURE:     <5 TORR (PREFERABLY 1-2 TORR)
GAS VELOCITY:         >100 CM/SEC
WAFER TEMPERATURE:    600° - 800°C (650° - 750°C PREFERRED)
SUBSTRATE ROTATION:   5 RPM (APPROXIMATE)

HIGH RATE SILICON NITRIDE DEPOSITION METHOD AT LOW PRESSURES

CROSS-REFERENCE TO RELATED APPLICATIONS

This application is a divisional of U.S. application Ser. No. 08/909,461 filed Aug. 11, 1997 now U.S. Pat. No. 6,352,593, which is a continuation-in-part of U.S. application Ser. No. 09/228,835, filed Jan. 12, 1999, now U.S. Pat. No. 6,167,837, which is a continuation-in-part of U.S. application and Ser. No. 09/228,840, filed Jan. 12, 1999, now U.S. Pat. No. 6,321,680.

BACKGROUND OF THE INVENTION

1. Field of the Invention

The present invention relates generally to methods for chemical vapor deposition (CVD) of silicon nitride, and more particularly to a method for CVD of silicon nitride employing a novel combination of flow rate, temperature and pressure to achieve improved film properties at a high rate of deposition at low pressure.

2. Brief Description of the Prior Art

Silicon nitride is commonly used in the manufacturing of semiconductor devices wherein it is deposited onto substrates (i.e. wafers) by chemical vapor deposition. Deposition is carried out in a variety of commercially available hot wall and cold wall reactors by placing a substrate in a vacuum chamber, heating the substrate and introducing dichlorosilane and ammonia. Deposition rates of approximately 10–70 angstroms per minute are achieved for low pressure processes (less than 1 Torr) as described in *Chemical Vapor Deposition for Microelectronics* (A. Sherman, Noyes Publications, Park Ridge, N.J. (1987), p. 77), and 50–100 angstroms per minute for high pressure processes (10–200 Torr) as described in detail in U.S. Pat. Nos. 5,482,739 and 5,629,043. Higher deposition rates of 2,000 angstroms per minute have been reported for plasma enhanced depositions as reported in U.S. Pat. No. 5,399,387, however silicon nitride films deposited by plasma enhancement do not have the same properties as silicon nitride deposited without plasma enhancement.

Figure 1:
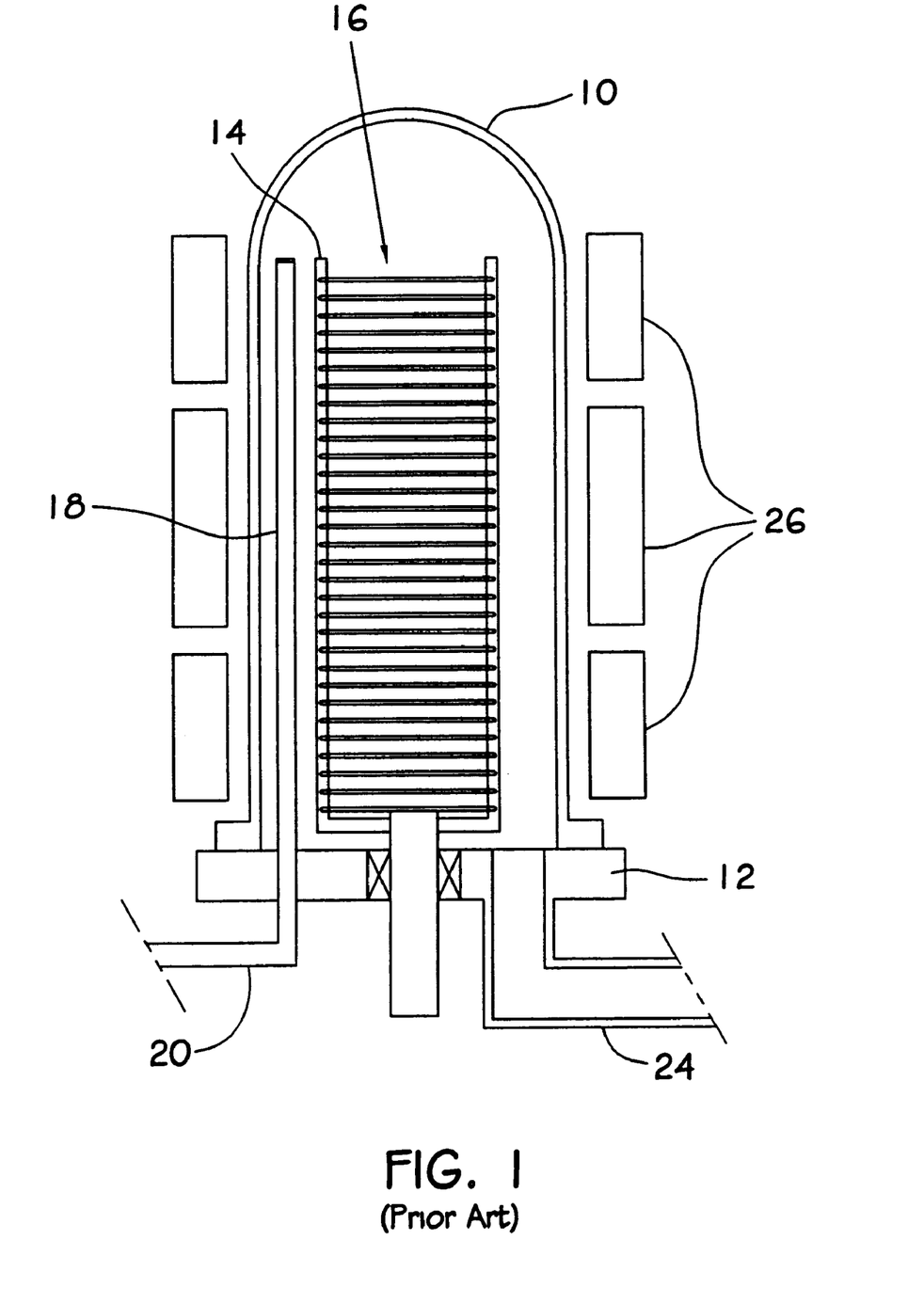
FIG. 1 illustrates a multiple wafer stack prior art reactor.

A typical prior art vertical furnace low pressure chemical vapor deposition (LPCVD) system is depicted in FIG. 1 and includes a chamber having a quartz tube 10 and chamber seal plate 12 into which is inserted a boat 14 for carrying a plurality of substrates 16. Dichlorosilane and ammonia gases enter the gas injection tube (or tubes) 18 from the gas inlet tube (or tubes) 20 through the chamber seal plate 12. The gases exit the process chamber through the seal plate 12 and out the exhaust port 24. A plurality of heater elements 26 are separately controlled and adjustable to compensate for the well-known depletion of the feed gas concentration as the gas flows from the gas injection tube 18 to the chamber exhaust port 24. This type of deposition system typically operates in the 200 mTorr to 500 mTorr range ($200\times10^{-3}$ Torr to $500\times10^{-3}$ Torr). Typical gas flows are 30 sccm of dichlorosilane, 200 sccm of ammonia and 1–2 slm of a carrier gas such as nitrogen or hydrogen. Operating at these low concentrations of dichlorosilane and ammonia results in low deposition rates of typically 10–60 angstroms per minute. Operation at higher concentrations of reactant gases results in non-uniform deposition across the substrates and great differences in the deposition rate from substrate to substrate. Increased flow rates could improve the deposition uniformity at higher pressures, however increased gas flow increases the reactive gas pressure at the injection tube holes causing gas phase nucleation resulting in particles being deposited on the substrates. Other problems associated with this reactor include film deposition on the interior quartz tube 10 and gas injection tube 18. This unwanted deposition decreases the partial pressure of the reactive feed gas concentration near the surface of the substrate 16 resulting in a reduced deposition rate and potential contamination caused when film deposited on the wall of tube 10 and injector tube 18 flakes off and deposits on the substrates 16. In addition, a major problem is the accumulation of reactant gas by-products, mainly composed of ammonium chlorides at the exhaust tube resulting in contamination of the substrates. Attempts have been made to deposit silicon nitride using silane in place of dichlorosilane to eliminate the ammonium chloride by products, however such attempts have resulted in non-acceptable film uniformity.

Figure 2:
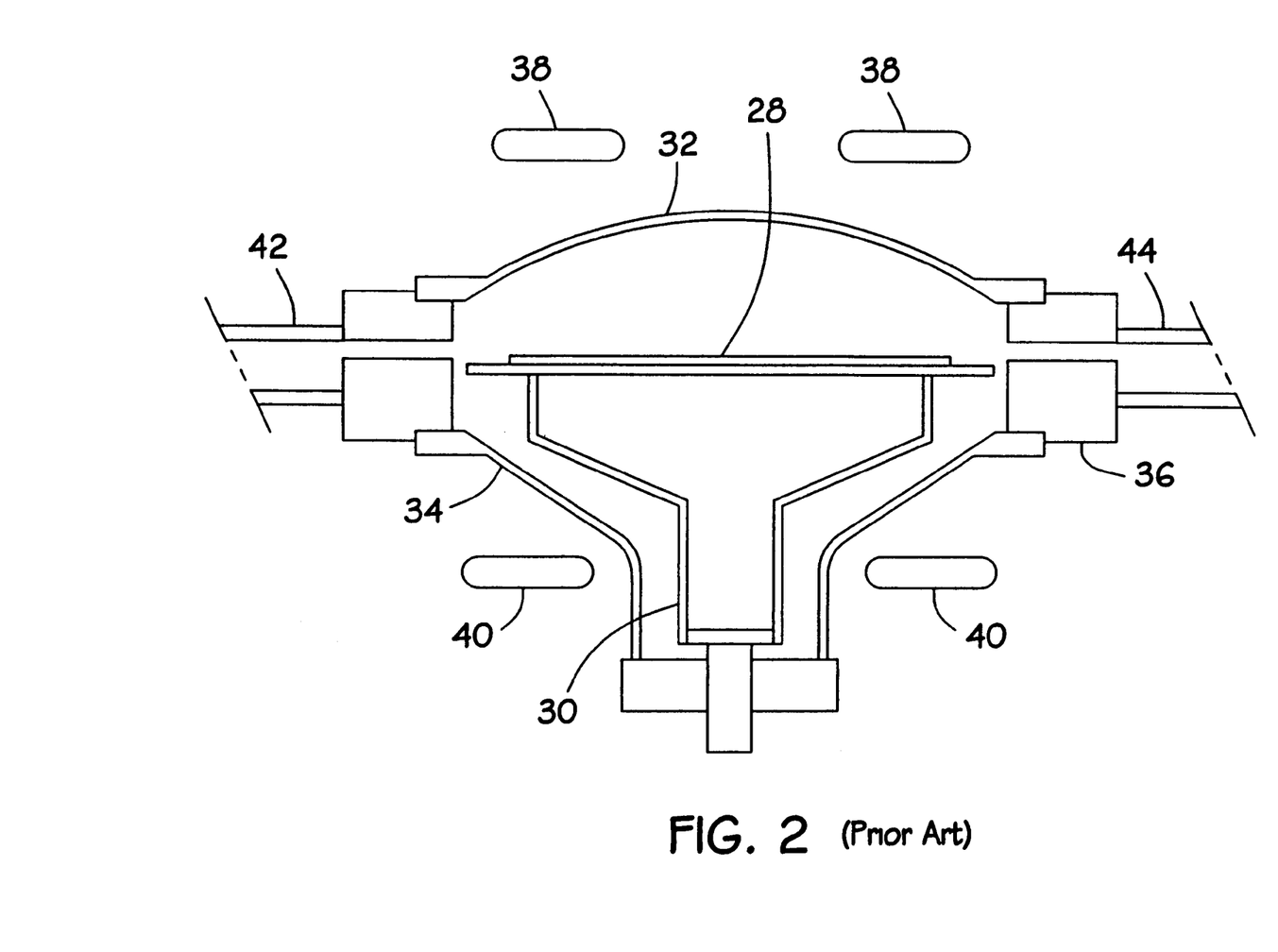
FIG. 2 illustrates a single wafer prior art reactor.

Another prior art reactor is illustrated in FIG. 2 and described in detail in U.S. Pat. No. 5,108,792. A substrate 28 is placed on a rotating substrate carrier 30, enclosed in a vacuum tight chamber having an upper quartz dome 32 and a lower quartz dome 34 and associated chamber wall 36. The substrate 28 is heated by upper lamps 38 and lower lamps 40. Reactant gases are injected through gas input tube 42 and exhausted through exhaust tube 44. This reactor overcomes some of the limitations of the vertical furnace reactor of FIG. 1. The reactor can be operated at higher pressures than vertical LPCVD furnaces and does not have an injector tube and its associated problems.

U.S. Pat. No. 5,482,739 entitled "Silicon Nitride Deposition" describes the process conditions and reactor modifications required to deposit silicon nitride at a rate of 70 angstroms per minute in the reactor described in U.S. Pat. No. 5,108,792. The reactor modifications reduce the accumulation of ammonium chloride by-products. The typical process pressure range is 10–200 Torr for depositing silicon nitride on a silicon substrate. This process pressure is approximately 2 orders of magnitude higher than the nominal deposition pressure of a similar LPCVD process.

Increased deposition rates are very desirable, resulting in higher machine productivity and more importantly reducing the time the substrates are exposed to high temperatures, i.e. >600° C. Reduced time at high temperatures is important during the fabrication of semiconductor devices as the device sizes become smaller, because elevated temperatures, i.e. >600° C., for any extended time cause unwanted changes in semiconductor device structure. A disadvantage of the prior art low pressure methods is their low deposition rate. A disadvantage of the prior art high pressure methods is that operating at high pressure can cause a gas phase reaction which can produce particulate contamination on the wafer.

U.S. Pat. No. 5,551,985 by Brors et al. describes a CVD reactor that provides improved uniformity in heating a wafer, and a highly uniform gas flow across the surface of a wafer. U.S. patent application Ser. No. 08/909,461 filed on Aug. 11, 1997, and Ser. Nos. 09/228,835 and 09/228,840 filed on Jan. 12, 1999, the disclosures of which are incorporated herein by reference, describe wafer chambers in which related processes may also be used.

SUMMARY OF THE INVENTION

It is an object of the present invention to provide a method for rapid deposition of a silicon nitride film having a highly uniform, smooth surface.

It is a further object of the present invention to provide a method of operating a CVD reactor that optimizes the rate and uniformity of deposition of silicon nitride.

It is a still further object of the present invention to provide a method of operating a CVD reactor that results in a high degree of uniformity in deposition of silicon nitride from one run to another.

It is another object of the present invention to provide a method of operating a CVD reactor that optimizes the rate and uniformity of deposition of silicon nitride, and substantially reduces the accumulation of ammonium chloride by-products.

Briefly, a preferred embodiment of the present invention includes a method of operating a CVD reactor providing a novel combination of wafer temperature, gas flow and chamber pressure resulting in both rapid deposition and a uniform, smooth film surface. According to the method, a wafer is placed in a vacuum chamber wherein a reactant gas flow of silane and ammonia is directed in parallel with the wafer surface via a plurality of temperature controlled gas injectors, the gas being confined to a narrow region above the wafer. The gas is injected at a high velocity, causing the deposition rate to be limited only by the rate of delivery of unreacted gas to the wafer surface and the rate of removal of reaction byproducts. The high velocity gas stream passing across the wafer has the effect of thinning the layer adjacent the wafer surface containing reaction by-products, known as the "boundary layer," resulting in faster delivery of the desired reactant gas to the wafer surface. The rapid gas flow also reduces the gas residence time above the substrate surface, and sweeps out unwanted reaction by-products resulting in a further increase in the relative concentration of the desired reactant species and reduced incorporation of unwanted reaction by-products in the deposited film.

An advantage of the present invention is that it results in more rapid deposition of silicon nitride.

A further advantage of the present invention is that it provides a process resulting in a reduced incorporation of unwanted by-products in a deposited silicon nitride film.

A still further advantage of the present invention is that it provides a method resulting in higher rate deposition of silicon nitride with improved film uniformity and reproducibility between batches.

DETAILED DESCRIPTION OF THE PREFERRED EMBODIMENTS

The method of the present invention will now be described in reference to the flow chart of FIG. 3. The process begins by placing a wafer on a carrier in a deposition chamber for deposition of silicon nitride (46). The carrier is rotated (48) and heated (50). The order of steps 48 and 50 is not significant in that the rotation is for the purpose of enhancing the uniformity of silicon nitride deposition, and may be initiated any time prior to the injection of the reactant gases and then maintained during the deposition.

The wafer is preferably heated as uniformly as possible, with heat sources above, below and surrounding the edge of the wafer. The temperature range for heating the wafer is between 500° C. and 800° C., with a preferred range of 650° C. to 750° C.

When the wafer is at the desired temperature, the process gases including ammonia and silane are injected (52). The preferred volume ratio of ammonia-to-silane is indicated in FIG. 3 as 1:1 to 5:1, with an ammonia flow rate between 500–600 sccm and a silane flow rate between 100–400 sccm. The gas pressure in the chamber is maintained less than 5 Torr, and preferably between 1 and 2 Torr, with the gas preferably injected through a plurality of cooled injector nozzles with injection ports in close proximity to the wafer edge, the nozzles oriented so as to direct the flow parallel and close to the wafer surface. The gas is controlled to flow at a velocity in excess of 10 cm/second and preferably at least 50 to 100 cm/second across the wafer surface in a narrow space confined to the region from the wafer surface to a maximum distance above the wafer of ½" to 1½". The velocity of the gas should be sufficient to reduce the gas residence time over the wafer to less than 500 milliseconds and preferably less than 200 milliseconds. Subsequent to deposition, the gas is turned off and evacuated from the chamber, the rotation is stopped, and the wafer removed (54).

The results achievable with the method of the present invention as described above in reference to FIG. 3 represent a major improvement in silicon nitride deposition. As discussed in the section on prior art, previous systems achieved high rates of silicon nitride deposition (1,000–3,000 Å/minute) in plasma enhanced methods that have the disadvantage of being more complicated. A major advantage of the method of the present invention is that it provides a very high deposition rate at low chamber pressures, resulting in very smooth, uniform and consistent surfaces. With the method of the present invention, deposition rates of 3,000 Å/minute are achieved at chamber pressures in the range of 2,000 mTorr. Film uniformity is typically 1.5%, measured between the center of a 200 mm diameter silicon wafer and a point 3 mm from the edge of the wafer. The reasons for the improved performance will now be described in detail, referring to each of the critical parameters of pressure, temperature and gas velocity.

In accordance with the present invention, a wafer/substrate is placed on a rotatable carrier in a vacuum chamber wherein a high velocity reactant gas for depositing silicon nitride, such as ammonia and silane, enter the reactor/chamber in relatively close proximity to the rotated, heated wafer. The gas is injected across the wafer at a velocity in excess of 10 cm/second and preferably in excess of 50 to 100 cm/second, and is confined to a very narrow region above the wafer so as to maximize the gas concentration at the wafer surface. According to the method, the reactant gas is preferably confined to the region extending from the wafer surface to ½", but no more than 1½" above the wafer. The high velocity gas stream passing across the wafer surface has the effect of thinning what is known as a "boundary layer" immediately above the wafer. The boundary layer is a region wherein unwanted reaction by-products collect. This layer normally slows the rate of incidence of reactant gas, and thereby slows the rate of deposition. The high velocity gas stream of the present invention sweeps out the unwanted by-products, thinning the boundary layer, allowing a higher rate of desired reactant gas to reach the wafer surface, i.e., resulting in a further increase in the relative concentration of the desired reactant species and a corresponding increase in silicon nitride deposition. The thinning of the boundary layer has the additional advantage of reducing incorporation of unwanted reaction by-products in the deposited film.

The method of the present invention provides a combination of elements, including rapid application of reactant gas and removal of unwanted by-products, reducing the boundary layer, operation between 500° C.–800° C. and at a pressure less than 5 Torr that results in a very high deposition rate in a range including 3,000 Å/minute. The non-uniformity of the deposited silicon layer is less than 1.5%, measured between the center of the wafer and a point 3 mm from the edge of a 200 mm diameter wafer.

Figure 4:
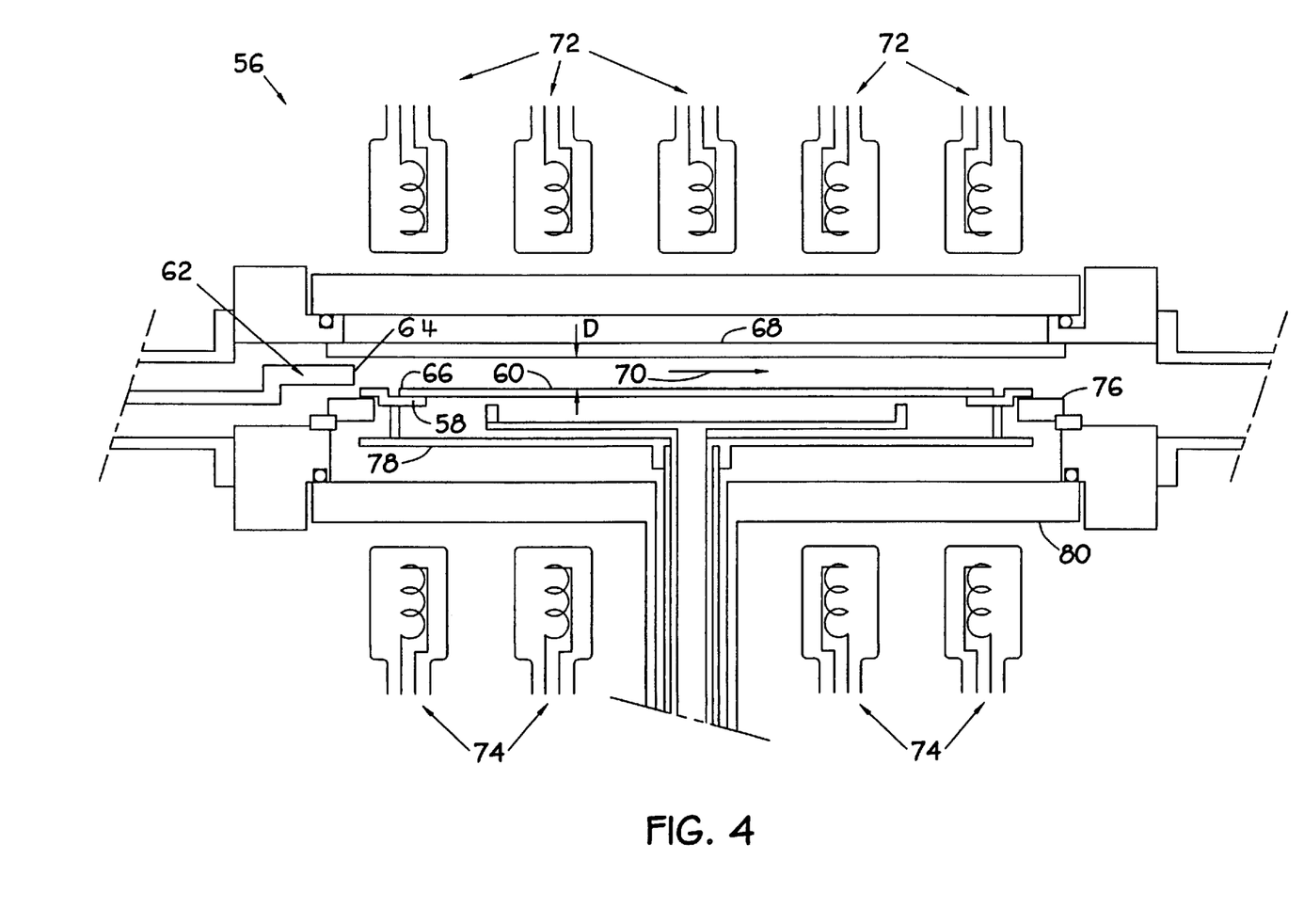
FIG. 4 shows a reactor that can be used to implement the method of the present invention.

The development of the method of the present invention was accomplished through use of a reactor similar to that shown in the cross-sectional view of FIG. 4. The structure of this apparatus is described in detail in U.S. Pat. No. 5,551,985. According to the method, a reactant gas is injected in close proximity to the edge of the wafer, and directed across and parallel to the wafer surface at a high velocity, confined to a narrow region above the wafer. FIG. 4 shows a reactor 56 having a rotatable susceptor 58 upon which is placed a wafer 60. A gas injector apparatus 62 including a plurality of nozzles with jets/openings 64, is positioned in close proximity to the wafer edge 66, and is oriented to direct a flow of reactant gas across and parallel to the wafer 60. The gas is further confined to a narrow region of width D above the wafer surface by a thermal plate 68 positioned over the wafer. The optimum gap D lies between ½" and 1½", and the speed of gas flow from injector 62 across the wafer was found to optimally exceed 100 cm/second in the direction indicated by arrow 70, for the purposes of optimum reactant gas supply to the wafer surface and removal of reaction by-products according to the method described above.

FIGS. 7 and 9 of U.S. Pat. No. 5,551,985 show a gas injector, representative of injector 62 of FIG. 4, with a plurality of nozzles. According to an alternate embodiment of the present invention, a first process gas such as ammonia is injected through a first plurality of the nozzles, and a second process gas such as silane is injected through a second plurality of the nozzles, the first and second plurality of nozzles being selected from the array of nozzles such as those illustrated in FIGS. 7 and 9 of U.S. Pat. No. 5,551,985.

Figure 3:
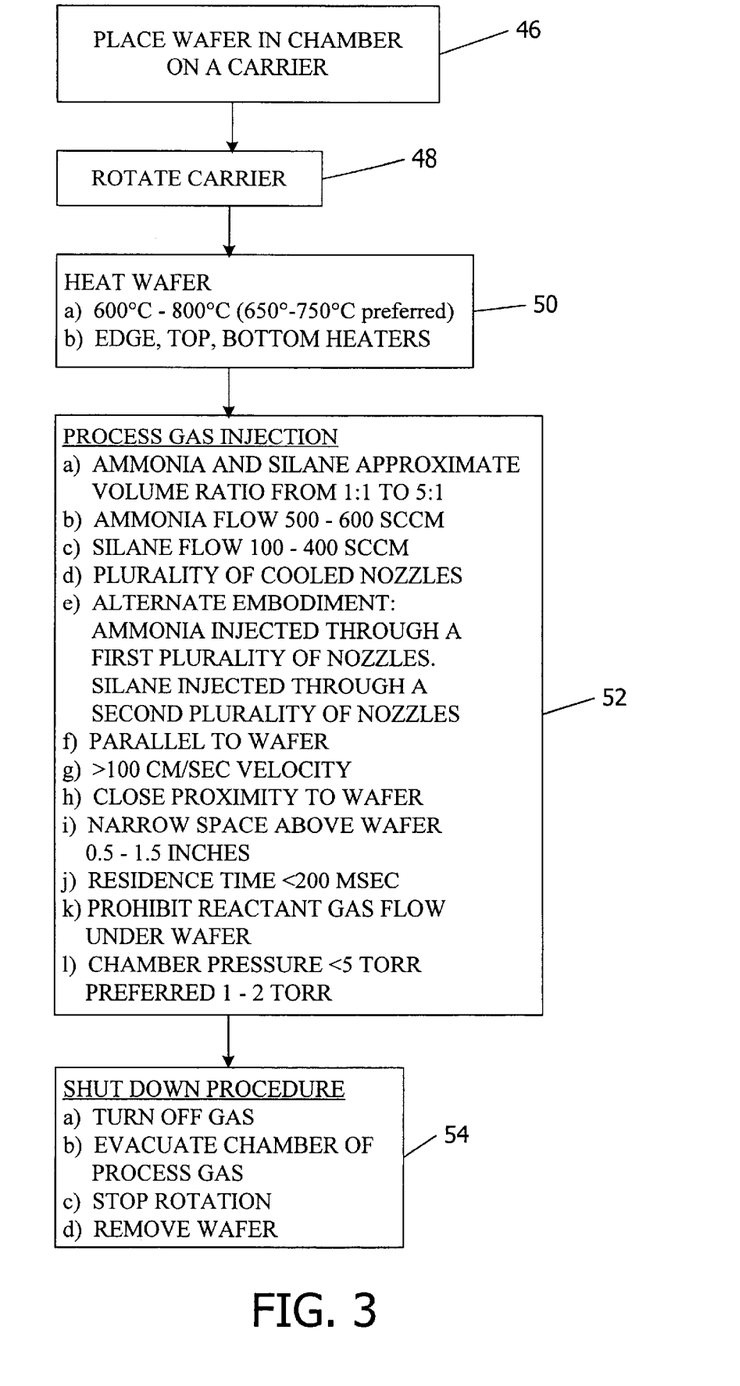
FIG. 3 is a flow chart illustrating the steps of the preferred embodiment of the present invention.

According to the order of operations described in reference to FIG. 3, the substrate/wafer 60 is first placed on the carrier 58 and then brought to an operating temperature between 500° C. and 800° C., preferably between 650° C. and 750° C. Typically, the apparatus of FIG. 4 can reach the temperature in about 20 seconds with heaters 72 above, 74 below, and a heat block 76 surrounding the carrier, the combination providing the advantage of uniform heating of the wafer 60. The carrier is then rotated at a speed of approximately 5 RPM, and the reactant gas, including ammonia and silane, is injected. The method of the present invention minimizes deposition on chamber surfaces by specifying that the reactant gas be confined to a narrow region above the substrate. The apparatus of FIG. 4 further assists in this objective by blocking reactant gas from passing underneath the substrate. This is accomplished by injecting a non-reactive gas (argon) at a low pressure under the substrate, between thermal plate 78 and lower quartz window 80. The details of the apparatus construction are fully described in U.S. Pat. No. 5,551,985, incorporated herein by reference.

Figure 5:
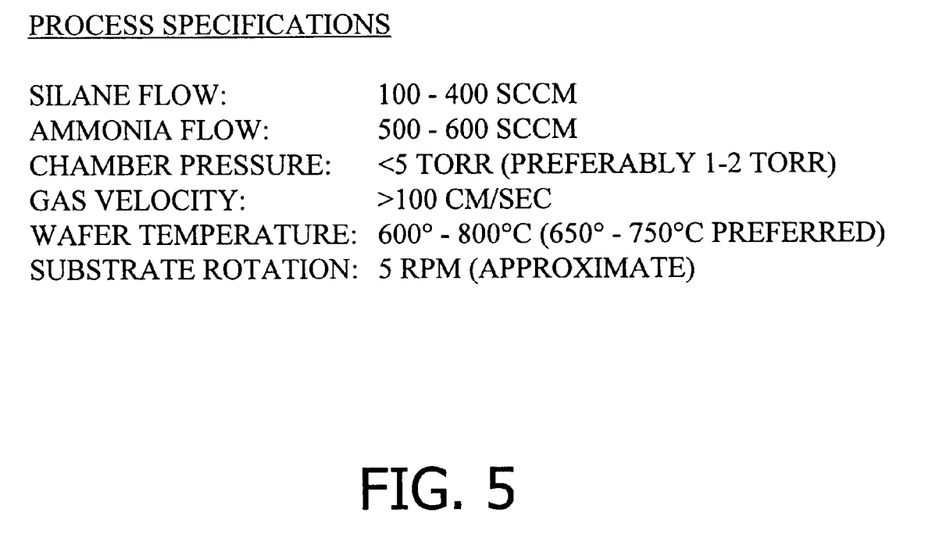
FIG. 5 is a list of operating parameters according to the present invention.

The preferred specifications for the method according to the present invention are listed in FIG. 5, including a silane flow rate in the range of 100–400 sccm, an ammonia flow rate of 500–600 sccm, a chamber pressure in the range of 1–2 Torr, but less than 5 Torr, a gas velocity in excess of 100 cm/second confined to ½" over the wafer yielding a gas residence time of less than 200 msec, a wafer uniformly heated to a temperature in the range of 500° C.–800° C. (preferably 650° C.–750° C.), and wafer rotation at a preferred rate of 5 RPM. Other rotation speeds are also included in the spirit of the present invention.

Other factors that contribute to the performance of the method applied to the apparatus of FIG. 4 include the plurality of water-cooled injector nozzles, prevention of reactant gas flow underneath the wafer, gas nozzles/jets directed across and positioned close to the ends of the wafer, and uniform wafer heating with heaters above, below, and around the edge of the wafer.

Figure 6:
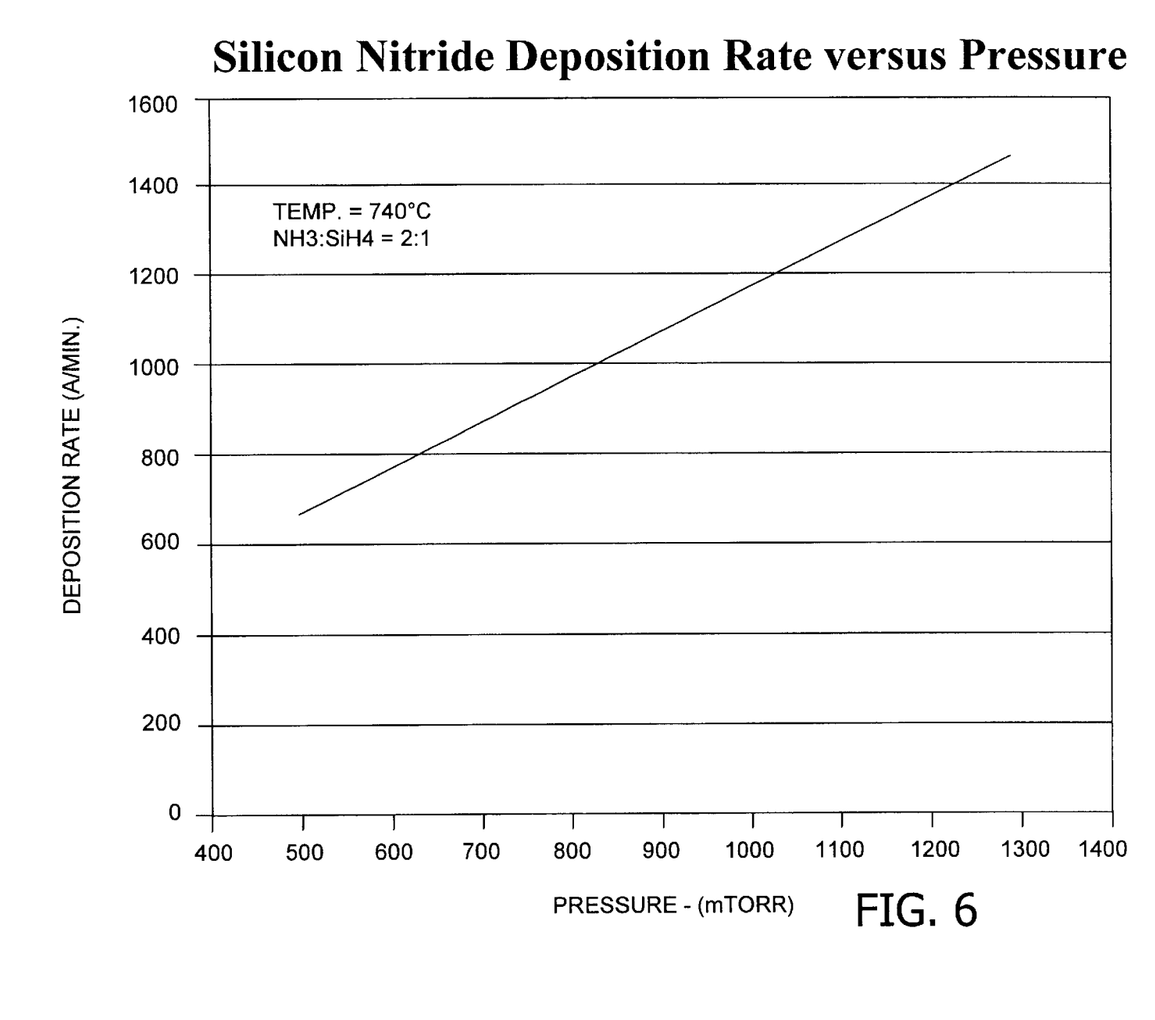
FIG. 6 is a graph of deposition rate vs pressure.
Figure 7:
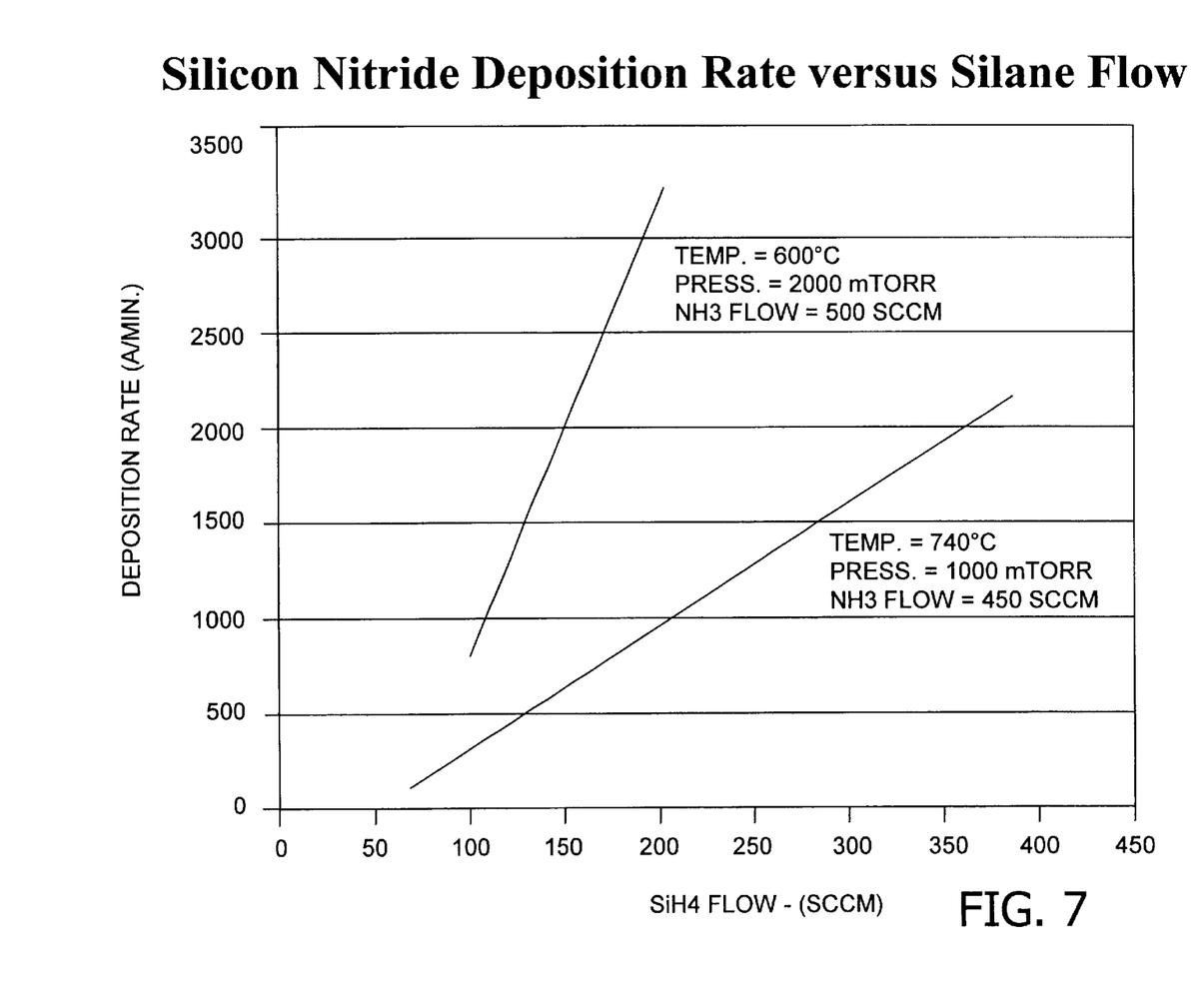
FIG. 7 is a graph of deposition rate vs silane flow.

Various performance factors are illustrated in the graphs of FIGS. 6 and 7. FIG. 6 shows the silicon nitride deposition rate versus chamber pressure with a wafer temperature of 740° C. and an ammonia-to-silane volume ratio of 2:1. FIG. 7 shows the deposition rate versus the rate of silane flow for two different sets of conditions of temperature, pressure, and ammonia flow rate.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of depositing silicon nitride, comprising:
   (a) placing a plurality of wafers on a wafer boat in a deposition chamber, wherein
      (i) said chamber has a top, a bottom, and one or more sidewalls including a metal portion, said chamber further including a chamber side wall including a window for transmission of radiant heat energy from the exterior of said chamber through said window to said interior of said chamber, and a plurality of diffuser shield plates of low thermal mass material with gaps interposed between said plates, at least one of said plates positioned between said window and said interior for diffusing said heat energy for heating said wafers;
      (ii) at least one radiant heat source located on the exterior of said vacuum chamber for transmitting heat energy through said window to said interior for heating said diffuser shield plate;
      (iii) cooling apparatus for cooling of said metal portion of at least one of the top, bottom, or side walls;
      (iv) a positioning apparatus for positioning said boat in said interior of said chamber;
      (v) a gas injector apparatus including a plurality of gas nozzles, for injecting a reactant gas substantially parallel across the deposition surface of each wafer, said gas injection apparatus located in a gap between said diffuser shield plates whereby the heat load on the gas injection apparatus is reduced; and
      (vi) a gas exhaust for pulling said reactant gas substantially parallel across the deposition surface of each wafer, said exhaust apparatus positioned opposite said boat from said injector apparatus for exhausting said gas from said chamber;
   (b) rotating said wafer boat;
   (c) heating said wafers to a temperature in the range of 500° to 800° C.;

(d) injecting a process gas for deposition of silicon nitride parallel to a surface of said wafers at a rate of at least 10 cm/sec, wherein said process gas is introduced through said plurality of gas nozzles, which are positioned so as to concentrate the gas at the surface of the wafers; and (e) maintaining a chamber pressure at a value less than 5 Torr.

2. A method as recited in claim 1 wherein said wafers are heated to a temperature between 650° C. and 750° C.

3. A method as recited in claim 1 wherein said velocity is adjusted to cause an average gas residence time less than 500 milliseconds.

4. A method as recited in claim 1 wherein said process gas includes ammonia and silane.

5. A method as recited in claim 4 wherein said ammonia is introduced into said chamber at a flow rate between 500 sccm and 600 sccm, and said silane is introduced into said chamber at a flow rate between 100 sccm and 400 sccm.

6. A method as recited in claim 1 wherein said chamber pressure is maintained in the range from 1–2 Torr while said process gas is being introduced into said chamber.

7. A method as recited in claim 1 wherein said gas nozzles are temperature-controlled.

8. A method as recited in claim 7 wherein said gas nozzles are water-cooled.

9. A method as recited in claim 1 wherein said gas nozzles are directed at the wafer surfaces.

10. A method as recited in claim 4 wherein said ammonia gas is injected through a first plurality of nozzles, and said silane is injected through a second plurality of nozzles.

11. A method as recited in claim 1 wherein the reactant gas is confined to a narrow space above each wafer.

12. A method as recited in claim 1 wherein the process gas passes over the upper surface of each wafer and is prevented from contacting the lower surface of each wafer.

* * * * *